United States Patent [19]

Piejak et al.

[11] Patent Number: 5,055,772

[45] Date of Patent: Oct. 8, 1991

[54] HIGH VOLTAGE IGNITION SYSTEM MONITOR FOR SPARK INITIATED INTERNAL COMBUSTION ENGINES

[75] Inventors: Robert B. Piejak, Wayland; Walter P. Lapatovich, Marlborough, both of Mass.

[73] Assignee: GTE Laboratories Incorporated, Waltham, Mass.

[21] Appl. No.: 407,990

[22] Filed: Sep. 15, 1989

[51] Int. Cl.$^{5}$ .................... G01R 31/024; G01R 31/22

[52] U.S. Cl. ...................................... 324/122; 324/96; 324/395

[58] Field of Search .................. 313/642; 324/96, 122, 324/395, 384

[56] References Cited

U.S. PATENT DOCUMENTS

| | | | |
|---|---|---|---|
| 1,796,637 | 3/1931 | Trugner | 324/122 |
| 3,141,107 | 7/1964 | Wasserman | 324/122 |
| 3,242,366 | 3/1966 | Candelise | 324/395 |
| 3,348,087 | 10/1967 | Smith | 324/395 |
| 3,369,175 | 2/1968 | Morris | 324/395 |
| 3,521,157 | 7/1970 | Robertson | 324/395 |
| 4,032,814 | 6/1977 | Shurgan | 313/642 |

FOREIGN PATENT DOCUMENTS

| | | | |
|---|---|---|---|
| 286031 | 3/1928 | United Kingdom | 324/395 |
| 8502229 | 5/1985 | World Int. Prop. O. | 324/395 |

OTHER PUBLICATIONS

Sanford; C. Brown, "*Basic Data of Plasma Physics*", pp. 145, 240 (1959).

1988 J. C. Whitney & Co., Automotive Parts & Accessories, p. 178.

*Primary Examiner*—Kenneth A. Wieder
*Assistant Examiner*—Jose M. Solis
*Attorney, Agent, or Firm*—Carl F. Ruoff

[57] ABSTRACT

A method and device for continuously monitoring the distributed high voltage pulses from an ignition coil of an electrical system of an internal combustion engine is disclosed. The device is a transparent enclosure filled with a noble gas at low pressure. The inner wall of the enclosure is coated with a light emitting phosphor and a small amount of mercury is placed within the enclosure. When the device is placed near a high voltage wire, an electric field capacitively couples to and ionizes the gas within the device. The mercury is excited and emits photons of ultraviolet radiation which in turn creates visible light as the ultraviolet radiation excites the phosphor coating. When this device is placed next to a spark plug wire, it will illuminate when there are high voltage pulses in the wire. In a preferred embodiment two or more enclosures are placed near the same wire. The enclosures contain different gas pressures and are excited at different voltages. This gives a quantitative measure of the high voltage pulse in the wire.

11 Claims, 2 Drawing Sheets

HIGH VOLTAGE IGNITION SYSTEM MONITOR FOR SPARK INITIATED INTERNAL COMBUSTION ENGINES

FIELD OF THE INVENTION

This invention relates to a monitor for a high voltage system. More particularly, this invention relates to a monitor for a high voltage ignition system for spark initiated internal combustion engines.

BACKGROUND OF THE INVENTION

To determine if a high voltage (HV) pulse is coming out of the ignition coil of an internal combustion engine, a high voltage wire is normally removed from a spark plug or from the distributor, and the wire is held a very short distance from the electrical ground of the engine. If a spark is seen to jump between the HV wire and ground then it is known that there is a significant high voltage pulse at that point in the circuit. While there are other ways to check for a spark, all of them depend on either removal of the spark plug wire and insertion of a test device, or cumbersome inductive coupling methods, e.g., ferrite core pick-up coils, as in a conventional timing light circuit. One disadvantage of these techniques includes the removal of the wire and insertion of a test device and possible electrical shock when performing this test.

SUMMARY OF THE INVENTION

A method and device for continuously monitoring the high voltage pulses from the ignition coil of the electrical system of an internal combustion engine is described. The device is a transparent enclosure filled with a inert gas at a low pressure (approximately 0.5-25 torr). The inner wall of the enclosure is coated with a light emitting phosphor and a small amount of mercury is placed within the enclosure. When the device is positioned near a wire with a high voltage pulse, such as a spark plug wire, an electric field is created which ionizes the inert gas contained within the enclosure. Along with the ionization, the mercury is excited and emits photons of ultraviolet radiation which are transformed into visible light when the phosphor coating is exposed to the ultraviolet radiation. Thus, if the device lights, it is a positive indication that a high voltage pulse is traveling through the wire. If there is no light, it is an indication that there is a problem in the electrical system.

In a second aspect of the present invention, a plurality of transparent enclosures each with a successively greater pressure are placed next to the HV wire. This allows a quantitative measure of the voltage of the pulse as breakdown voltage is proportional to gas pressure within the enclosure.

It is therefore an object of the present invention to provide a method and apparatus for monitoring the HV pulses from the ignition coil of an internal combustion engine.

Yet another object of the present invention is to provide a method and device for monitoring high voltage pulses of an internal combustion engine without danger of electrical shock.

Still another object of the present invention is to provide a method and device for monitoring high voltage pulses from the ignition coil of an internal combustion engine which requires no wires.

For a better understanding of the present invention, together with other and further objects, advantages and capabilities thereof, reference is made to the following disclosure and appended claims in connection with the above-described drawing.

DETAILED DESCRIPTION OF THE PREFERRED EMBODIMENTS

The high voltage monitoring device of the present invention is a light transparent or translucent enclosure that is filled with a noble gas (e.g. neon, argon) at a pressure of approximately 2 torr. A small amount of mercury (Hg) sufficient to produce a vapor pressure of approximately 2 millitorr is placed within the enclosure and the inner wall of the enclosure is coated with a light emitting phosphor that responds to ultraviolet radiation generated by excited mercury ions. The device is positioned adjacent a high voltage wire so that the potential of the high voltage wire creates an intense electric field within the enclosure which ionizes the low pressure gas contained therein. Along with the ionization the Hg is excited and emits photons of ultraviolet (uv) radiation. The phosphor coating emits visible light when exposed to the ultraviolet radiation indicating high voltage in the wire.

A phosphor coated tube is used to get more light from the ionized gas than could be attained under similar conditions in a pure rare gas, although gases in transparent tubes may also be used in a simpler embodiment. However, an uncoated tube will not emit as much visible light as a coated tube. This is due to mercury emitting radiation in the uv range which is not visible to the human eye. The actual operation of the instant invention is somewhat similar to that of a fluorescent lamp; however there are significant differences. In this invention the discharge is electrodeless, it is designed to break down at predetermined electric field levels, and its main function is that of an indicator not a light source.

Figure 1:
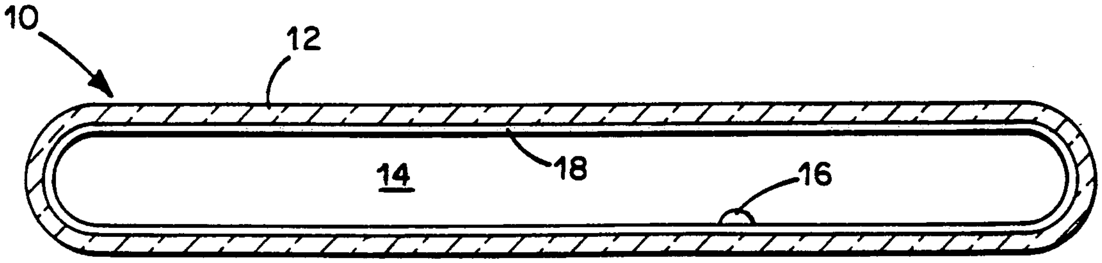
FIG. 1 is a cross-sectional view of a preferred embodiment of an electrodeless voltage monitoring envelope in accordance with the present invention.

One aspect of the monitoring tube is shown in FIG. 1. Voltage monitor 10 in this embodiment includes a dielectric enclosure, or glass tube 12 with low pressure gas 14 such as neon, and Hg 16 sealed therein. Phosphor coating 18 is deposited on inner wall 20 of glass tube 12. Although other dimensions may be employed, the tube outer diameter in this illustration is 3/16" and the tube length is about 2".

The tube length is not critical and may be made quite a bit longer, for example up to 6-8" or longer. It is a critical feature of the present invention that the combination of the gas pressure (P) and the selected tube diameter (d) be such that the gas will ionize at a preselected voltage.

It is known that gases will ionize or breakdown at a predetermined electric field strength depending on the pressure of the gas. This functionality has been determined for a number of gases as shown in "Basic Data of Plasma Physics" by Sanborn C. Brown, p 145, 240. Since the electric field strength is a function of the HV pulse and the distance of the monitor from the HV wire, one can design the monitor to breakdown or emit light at a predetermined voltage by placing the monitor at a specified distance from the HV wire, i.e., the thickness of the wire insulation.

Figure 2:
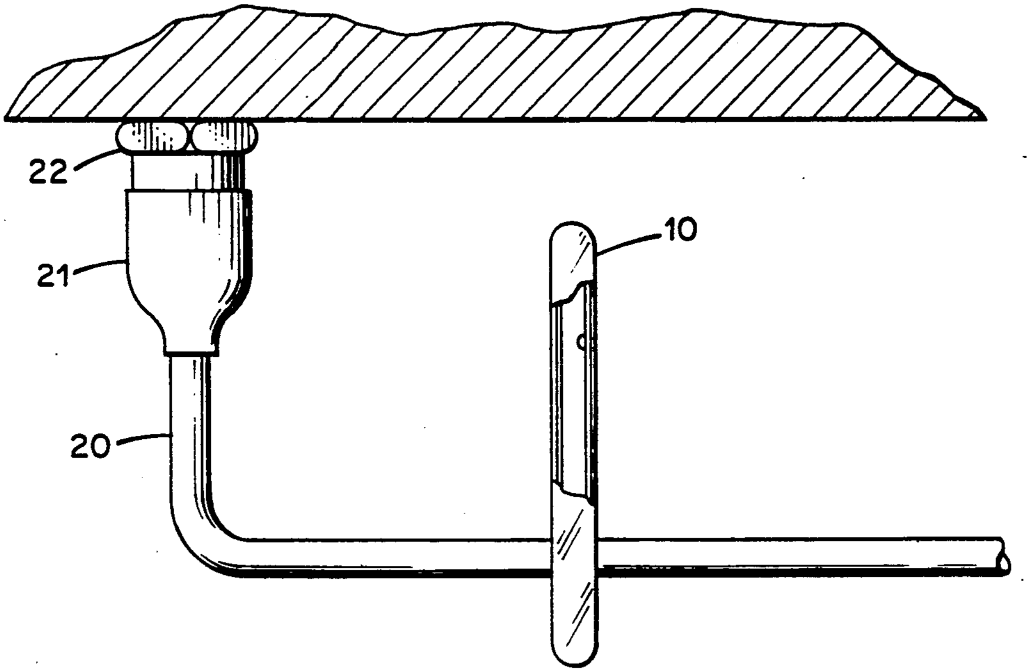
FIG. 2 is a diagrammatical representation of an embodiment of the positioning of the electrodeless voltage monitoring envelope as depicted in FIG. 1 in accordance with the present invention.

FIG. 2 shows monitor 10 positioned against HV wire 20 of an engine (not shown). HV wire 20 is attached to boot 21 which makes electrical contact with spark plug 22. Also shown in FIG. 2 is electrical ground 24.

The positioning of monitor 10 is critical since the electric field about HV wire 20 varies directly with distance from wire 20 itself. It is especially preferred that at least a portion of tube 12 be in contact, or nearly in contact, with the outer insulation of HV wire 20, because this has a major effect on the electromagnetic coupling between the tube and HV wire 20. When at least a portion of the gas within the tube ionizes, the remainder of the gas ionizes almost immediately thereafter. The position of the rest of the tube 12 is much less critical, although the best performance (most light emitted ) is observed when one end of the tube 10 rests on the HV wire and the other end is within close proximity, e.g. within an inch, of electrical ground 24 as shown in FIG. 2.

Figure 3:
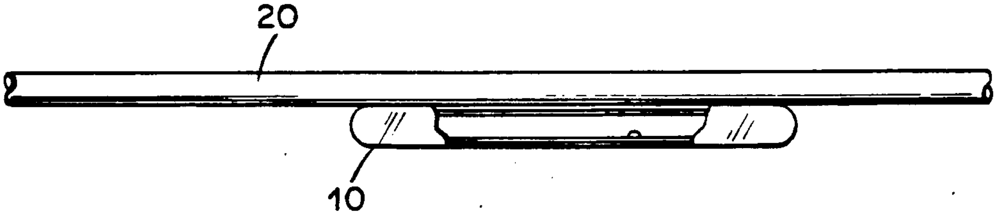
FIG. 3 is a diagrammatical representation of an another embodiment of the positioning of the electrodeless voltage monitoring envelope as depicted in FIG. 1 in accordance with the present invention.

FIG. 3 shows monitor 10 positioned against the HV wire 20 with tube 12 generally parallel to the major axis of the wire. In this embodiment ground plane 24 (not shown in FIG. 3) preferably is on the side opposite to where the tube 10 contacts the HV wire 20.

If a small ground plane is adhered to the outer wall of the glass tube, the glass tube can be positioned parallel to the HV wire. In this case, the ground plane should be on the side opposite to where the tube touches the wire. In this configuration, light emission is especially bright, indicating good coupling between the tube and the HV wire. An embodiment of that configuration is shown in FIG. 3.

Figure 4:
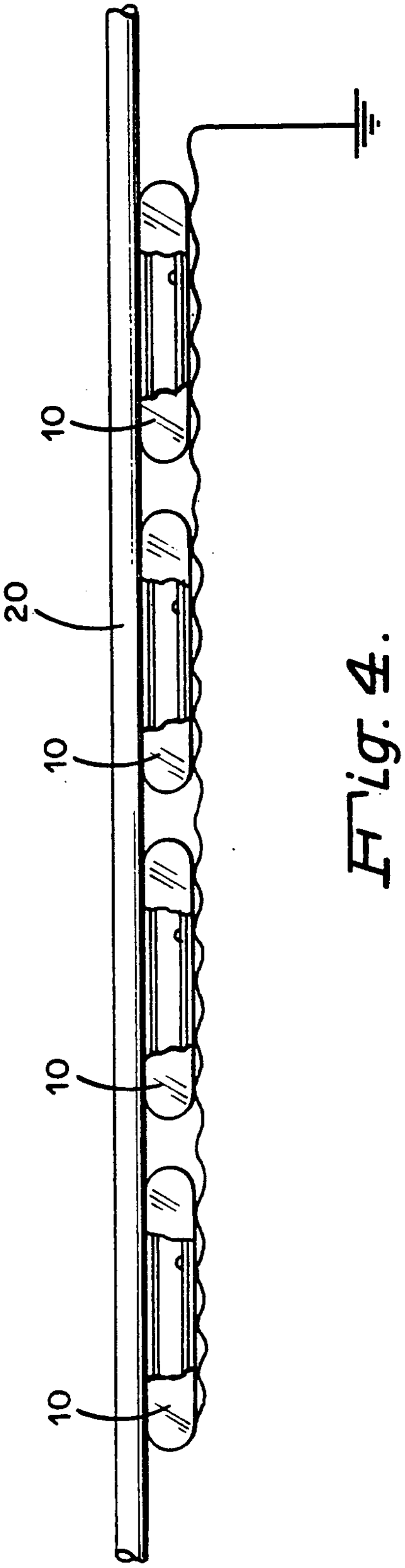
FIG. 4 is a diagrammatical representation of an embodiment of the positioning of more than one electrodeless voltage monitoring envelopes as depicted in FIG. 1 in accordance with the present invention.

Another embodiment of this technique is shown in FIG. 4. In this implementation, there are several monitors 10 of approximately equal diameter each having a different gas pressure placed against the HV wire 20. Since the gas pressure and tube diameter determine the breakdown voltage, an approximation of the voltage on the wire can be made by observing which tubes glow and which do not. Different color phosphors may be used to visually highlight this result. For example, when the ignition system spark plug operates correctly the HV on the wire is lower and a green phosphor in the monitor tube with a low breakdown voltage is used to indicate that the system is functioning properly. When a plug fails to spark, the voltage on the HV wire is increased causing breakdown in another monitor tube with a higher breakdown voltage. This tube has a red phosphor indicating that the system is faulty. If neither tube ionizes this would indicate lack of HV, or possibly, a shorted spark plug. A monitor located on the main HV wire from the ignition coil could differentiate between these two possibilities.

A further expansion of the method and device of the present invention would be to mount a tube on each spark wire and connect each tube to a fiber optic cable. The fiber optic cable could be brought out to the dashboard of the automobile. This would allow the driver to constantly monitor the HV of the spark plug wires. Alternatively, monitor signals could be connected through optoelectronic devices (e.g. photo transistors) to an onboard microprocessor for computer monitoring and control of the ignition system.

This invention makes it possible to continuously monitor a high voltage lead of any (or all) spark plugs and/or the wire from the ignition coil. The advantages of this technique are:

1. The monitoring of high voltage is performed continuously.

2. No parts of the electrical path are disturbed to make the determination of high voltage.

3. Chance of electrical shock is eliminated since operator contact with the electrical system is eliminated.

4. One embodiment of the instant invention yields an approximate measurement of the magnitude of the voltage on the wire. This information can be interpreted to determine the condition of the electrical wires carrying the high voltage, the condition of the ignition coil, and the overall performance of the high voltage electrical system.

5. The monitoring device described herein has an exceptionally long lifetime.

6. The monitoring device of the present invention may be applied to any engine that requires a high voltage electrical spark including automotive, marine or aircraft applications.

While there has been shown and described what is at present considered the preferred embodiment of the invention, it will be obvious to those skilled in the art that various changes and modifications may be made therein without departing from the scope of the invention as defined by the appended claims.

What is claimed is:

1. A high voltage ignition system monitor consisting of:

a light transmitting enclosure having an inner surface;
a phosphor coating on the inner surface;
a noble gas contained within the enclosure; and
an amount of mercury contained within the enclosure sufficient to provide mercury vapor within the enclosure;
wherein the enclosure emits detectable light when capacitively coupled to an insulated high voltage wire and when a high voltage pulse is applied to the insulated high voltage wire, creating an electric field within the enclosure sufficient to ionize the noble gas and excite the mercury vapor to emit 254 nm radiation.

2. The monitor according to claim 1 wherein said enclosure comprises glass.

3. The monitor according to claim 1 wherein the noble gas is neon.

4. The monitor according to claim 1 wherein the noble gas is argon.

5. The monitor according to claim 1 wherein the noble gas pressure is approximately 2 torrs.

6. The monitor according to claim 1 wherein the mercury pressure within said enclosure is approximately 2 millitorrs.

7. A high voltage ignition system monitor consisting of:

a plurality of light emitting enclosures each having an inner space;

a phosphor coating on the inner surface of each enclosure;

a noble gas contained within each enclosure in successively increasing amounts such that a higher gas pressure each successive enclosure results;

an amount of mercury contained within each enclosure sufficient to provide mercury vapor within each enclosure;

wherein the enclosures emit detectable light when capacitively coupled to an insulated high voltage wire and when voltage pulse is applied to the insulated high voltage wire creating an electric field within each sufficient to ionize the noble gas and excite the mercury vapor to emit 254 nm radiation, the successive enclosures emitting light at successively increasing voltage.

8. The monitor according to claim 7 wherein the phosphor coating on each enclosure emit radiation at different wavelengths.

9. A method of detecting high voltage within an insulated high voltage wire of an ignition system consisting of:

placing adjacent to the insulated high voltage wire of the ignition system; an enclosure having an inner surface coated with phosphor, the enclosure having a noble gas sealed therein and an amount of mercury sufficient to produce mercury vapor within the enclosure, the enclosure being capacitively coupled to the high voltage wire;

determining, upon application of a high voltage pulse to the insulated high voltage wire, whether the enclosure emits light, an emission of light indicating the presence a high voltage pulse within the insulated high voltage wire and no emission of light indicating a lack of high voltage pulses within the high voltage wire.

10. A method of approximating the voltage within an insulated high voltage wire of an ignition system comprising:

placing adjacent to the insulated high voltage wire a plurality of enclosures having an inner surface coated with phosphor, each enclosure having a successively increasing amount of noble gas sealed therein and an amount of mercury sufficient to produce mercury vapor within each enclosure, each enclosure being capacitively coupled to the insulated high voltage wire;

determining upon application of a high voltage pulse to the insulated high voltage wire which enclosures emit light indicating the presence of a high voltage pulse within the insulated high voltage wire and non-emission of light indicating the lack of sufficient high voltage pulses with the insulated high voltage wire, the voltage of the pulse being between the breakdown voltage of one of the plurality of enclosures which does not emit light and one of the plurality of enclosures which emits light.

11. A high voltage ignition system monitor for positioning near an insulated high voltage ignition wire consisting of:

a light transmitting enclosure having an inner surface;

a noble gas contained within the enclosure;

an amount of mercury contained within the enclosure sufficient to provide mercury vapor within the enclosure; and wherein the enclosure emits visible light when capacitively coupled to the insulated high voltage wire and when a high voltage pulse is applied to the insulated light voltage wire.

* * * * *